United States Patent [19]
Aida et al.

[11] Patent Number: 5,777,543
[45] Date of Patent: Jul. 7, 1998

[54] CERAMIC RESISTOR AND ELECTROSTATIC CHUCK HAVING AN ALUMINUM NITRIDE CRYSTAL PHASE

[75] Inventors: Hiroshi Aida; Kazuhiko Mikami; Kenji Kitazawa, all of Kokubu, Japan

[73] Assignee: Kyocera Corporation, Kyoto, Japan

[21] Appl. No.: 841,605

[22] Filed: Apr. 30, 1997

Related U.S. Application Data

[62] Division of Ser. No. 385,774, Feb. 9, 1995, Pat. No. 5,668,524.

[30] Foreign Application Priority Data

| Jan. 9, 1994 | [JP] | Japan | 6-208375 |
| Feb. 9, 1994 | [JP] | Japan | 6-15200 |
| Aug. 9, 1994 | [JP] | Japan | 6-187044 |
| Aug. 11, 1994 | [JP] | Japan | 6-189217 |
| Sep. 30, 1994 | [JP] | Japan | 6-237115 |
| Nov. 29, 1994 | [JP] | Japan | 294256 |
| Nov. 30, 1994 | [JP] | Japan | 296386 |

[51] Int. Cl.$^6$ ................................. H01C 1/012
[52] U.S. Cl. ................. 338/308; 338/309; 501/98.4; 427/101
[58] Field of Search .................. 338/306, 307, 338/308, 309, 223; 427/101; 501/98.4, 98.6; 279/128

[56] References Cited

U.S. PATENT DOCUMENTS

| 3,427,373 | 2/1969 | Matsuo | 510/98.6 |
| 4,042,479 | 8/1977 | Yamazaki et al. | 204/192.21 |
| 4,737,757 | 4/1988 | Senda et al. | 338/308 |
| 4,751,518 | 6/1988 | Ishikawa et al. | 347/204 |
| 4,778,778 | 10/1988 | Malia et al. | 501/153 |
| 4,786,916 | 11/1988 | Kato | 347/200 |
| 4,847,221 | 7/1989 | Horiguchi et al. | 501/98 |
| 5,068,211 | 11/1991 | Giunchi et al. | 111/991 |
| 5,280,156 | 1/1994 | Niori et al. | 279/128 |
| 5,294,388 | 3/1994 | Shimoda et al. | 501/98 |
| 5,306,679 | 4/1994 | Shimoda et al. | 501/153 |
| 5,306,895 | 4/1994 | Ushikoshi et al. | 219/385 |
| 5,314,850 | 5/1994 | Miyahara | 501/153 |
| 5,324,053 | 6/1994 | Kubota et al. | 279/128 |
| 5,367,285 | 11/1994 | Swinehart et al. | 338/308 |
| 5,382,469 | 1/1995 | Kubota et al. | 501/153 |
| 5,384,682 | 1/1995 | Watanabe et al. | 361/234 |
| 5,413,360 | 5/1995 | Atari et al. | 279/128 |

*Primary Examiner*—Michael L. Gellner
*Assistant Examiner*—Karl Easthom
*Attorney, Agent, or Firm*—Loeb & Loeb LLP

[57] ABSTRACT

A ceramic resistor comprising chiefly an aluminum nitride, and an electrostatic chuck using the ceramic resistor as a resistor layer. The ceramic resistor comprises chiefly an aluminum nitride crystal phase, and is doped with at least one kind of atoms selected from the group consisting of elements of the Groups 2b, 4b and 6b of periodic table, and exhibits a volume resistivity of not larger than $10^{14}$ $\Omega$-cm at 25° C.

3 Claims, 6 Drawing Sheets

CERAMIC RESISTOR AND ELECTROSTATIC CHUCK HAVING AN ALUMINUM NITRIDE CRYSTAL PHASE

This is a division of application Ser. No. 08/385,774, filed on Feb. 9, 1995, now U.S. Pat. No. 5,668,524

BACKGROUND OF THE INVENTION

1. (Field of the Invention)

The present invention relates to a ceramic resistor comprising chiefly an aluminum nitride which is suited for being used as a heater material, enclosure of a vacuum tube, antistatic material in an apparatus for producing semiconductors, wafer-conveying arm, wafer-handling jig and, particularly, electrostatic chuck, as well as to an electrostatic chuck using the above resistor as a resistor layer.

2. (Description of the Prior Art)

The electrically insulating ceramics have heretofore been adjusted for their electric resistance by adding electrically conducting materials to the electrically insulating ceramics. For instance, titanium nitride is added to the alumina to decrease its electric resistance.

The aluminum nitride is a non-oxidizing ceramic which has been expected for its use as a structural material and a high-temperature material. In recent years, it has been reported that the aluminum nitride exhibits excellent resistance even against plasma. Therefore, study has been forwarded to use the aluminum nitride as a part such as an electrostatic chuck in an apparatus for producing semiconductors. However, the aluminum nitride is a highly insulating material exhibiting a resistivity of not smaller than $10^{16}$ $\Omega$-cm even at room temperature, and has not been put into practical use.

In the apparatuses for producing semiconductors, an electrostatic chuck has been most widely used for holding and handling silicon wafers because of such advantages that it offers flat machining surfaces and degree of parallelism at the time of machining silicon wafers and that it makes it possible to machine the silicon wafers in vacuum.

Electrostatic chucks have heretofore been proposed such as the one having an insulating layer composed of alumina, sapphire, etc. formed on an electrode plate (Japanese Laid-Open Patent Publication No. 261377/1985), the one having an electrically conducting layer formed on an insulating substrate and having an insulating layer formed thereon (Japanese Laid-Open Patent Publication No. 34953/1992), the one having an electrically conducting layer incorporated in an insulating substrate (Japanese Laid-Open Patent Publication No. 94953/1987) and the like.

The trend toward an increase in the degree of integrating semiconductor elements on an integrated circuit in recent years has required an increase in the precision of the electrostatic chuck and, particularly, an increase in the corrosion resistance, wear resistance, heat resistance and shock resistance of the electrostatic chuck.

In particular, the ceramics used for such applications must have excellent resistance against plasma, and attempts have been made to use the aluminum nitride as an insulating layer for the electrostatic chuck since it has superior resistance against plasma to other ceramic materials.

As described above, however, the aluminum nitride itself is a highly insulating material having a resistivity of not smaller than $10^{16}$ $\Omega$-cm. On the other hand, the insulating layer for the electrostatic chuck must have a resistivity of not larger than $10^{14}$ $\Omega$-cm and, preferably, within a range of from $10^7$ to $10^{12}$ $\Omega$-cm, especially $10^8$ to $10^{12}$ $\Omega$-cm to enhance the efficiency for generating electrostatic force. Therefore, it is not allowed to use the aluminum nitride in its form as the insulating layer.

It has been attempted to decrease the electric resistance by modifying the aluminum nitride. For instance, Japanese Laid-Open Patent Publication No. 4509/1981 discloses a method of adjusting the resistivity by adding an electrically conducting material such as aluminum or the like to insulating ceramics such as aluminum nitride and boron nitride. As for thin-film ceramics, furthermore, Japanese Patent Publication No. 50364/1980 proposes a thin-film resistor having a small resistance-temperature coefficient by dispersing metal aluminum in, for example, the aluminum nitride.

However, the method of controlling the electric resistance by adding an electrically conducting material arouses a problem in that properties of the electrically conducting material impair the properties, such as resistance to plasma exposure, which is inherent in the insulating ceramics.

For instance, resistance to plasma and durability of the aluminum nitride may be lost, or properties of the aluminum nitride may be deteriorated.

In general, furthermore, the volume resistivity of an insulator tends to decrease with an increase in the temperature. In the case of the aluminum nitride, for instance, the resistivity which is $10^{16}$ $\Omega$-cm at room temperature decreases down to $10^{11}$ $\Omega$-cm at 300° C. and further decreases down to $10^7$ $\Omega$-cm at 600° C.

This results in the occurrence of such an inconvenience that when the insulator or the insulator layer is used as an electrostatic chuck material, the resistance undergoes a change due to a change in the temperature making it difficult to obtain a stable absorbing force and, further, imposing limitation on the temperature range that can be used.

To avoid such inconvenience, Japanese Laid-Open Patent Publication No. 160444/1990 proposes a structure comprising two or more insulating layers that are stacked, electrode layers corresponding to the insulating layers, an electric circuit and a switch, which can be used over a temperature range of from room temperature up to 400° C. Japanese Laid-Open Patent Publication No. 300137/1992 teaches an art in which a temperature detector such as heater or thermocouple is mounted in an electrostatic chuck, and a control unit is provided on an external side to control the power source unit depending upon a change in the temperature, in an attempt to stabilize the absorbing force and to broaden a range of temperature in which the electrostatic chuck can be used. However, when the number of electrode layers is increased by stacking two or more insulating layers as described above, the electric circuit becomes complex and, besides, the structure of the electrostatic chuck itself becomes complex. Accordingly, the step of production becomes complex, resulting in a decrease in the reliability of the products and an increase in the cost of production.

Even in a method which incorporates the heater, detects the temperature of the heater and controls the applied voltage, the electrostatic chuck can be no longer used if a defect occurs in the temperature detector such as thermocouple incorporated in the electrostatic chuck. Even according to this method, properties possessed by the ceramic material do not substantially change, and limitation is imposed on the range of use.

In order to cope with the above-mentioned problems, the present inventors have forwarded the study to realize a ceramic resistor having an electric resistivity of not larger than $10^{14}$ Ω-cm from the standpoint of its composition and structure, and have discovered the fact that there can be obtained an insulator having a volume resistivity of not larger than $10^{14}$ Ω-cm, exhibiting a small change in the resistivity relative to the temperature and stable properties over a wide range of temperatures by doping the insulator comprising chiefly the aluminum nitride formed by, for example, a chemical vapor-phase deposition method with a particular element in an amount over a predetermined range, and permitting the element to be solid-dissolved in the crystal of aluminum nitride so that the lattice constants of the aluminum nitride lie within predetermined ranges, and have thus arrived at the present invention.

SUMMARY OF THE INVENTION

It is therefore an object of the present invention to provide a ceramic resistor comprising chiefly an aluminum nitride crystal phase having excellent resistance against plasma and a volume resistivity which is suppressed to be not larger than $10^{14}$ Ω-cm.

Another object of the present invention is to provide a ceramic resistor having a resistivity which changes within a small range depending upon a change in the temperature, and exhibits stable properties over a wide range of temperatures.

A further object of the present invention is to provide an electrostatic chuck having the above-mentioned ceramic resistor layer as an insulating layer.

According to the present invention, there is provided a ceramic resistor comprising chiefly an aluminum nitride crystal phase, wherein the resistor is doped with at least one kind of atoms selected from the group consisting of elements of the Groups 2b, 4b and 6b of periodic table, and exhibits a volume resistivity of not larger than $10^{14}$ Ω-cm at 25° C.

According to the present invention, furthermore, there is provided an electrostatic chuck having a ceramic resistor layer comprising chiefly an aluminum nitride crystal phase on the surface of a substrate which has an electrode, wherein the resistor layer is doped with at least one kind of atoms selected from the group consisting of elements of the Groups 2b, 4b and 6b of periodic table, and exhibits a volume resistivity over a range of from $10^7$ to $10^{13}$ Ω-cm at 25° C.

PREFERRED EMBODIMENTS OF THE INVENTION

Figure 1:
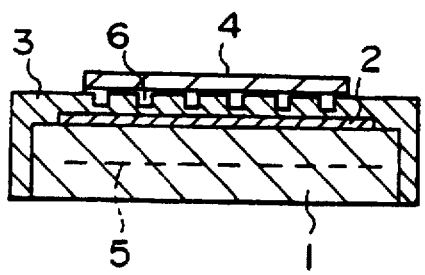
FIG. 1 is a sectional view illustrating the structure of an electrostatic chuck according to the present invention.

The ceramic resistor according to the present invention comprises chiefly an aluminum nitride crystal phase and is doped with at least one kind of element selected from the group consisting of elements of particular Groups of periodic table in an amount within a particular range, and can roughly be divided into resistors of the following three aspects.

The resistor according to a first aspect of the invention is doped with an element of the Group 6b of periodic table in an amount of from 0.005 to 20 atomic %.

The element of the Group 6b of periodic table is an important element for imparting electrically conducting property to the aluminum nitride. When the amount of this element is smaller than 0.005 atomic %, the desired resistivity is not obtained and when the amount of this element exceeds 20 atomic %, other crystal phase tends to build up making it difficult to control the resistivity and permitting a thin film thereof to be peeled off or cracked. Concretely speaking, the elements of the Group 6b of periodic table include O, S, Se and Te. Among them, O, S and Se are desirable from the standpoint of film-forming property and O is particularly preferred.

From the standpoint of structure, the ceramic resistor comprises chiefly crystals of aluminum nitride and wherein the element of the Group 6b of periodic table partly solid-dissolves in the crystals of aluminum nitride. Due to some part of the element of the Group 6b of periodic table that is not solid-dissolved in the crystals, however, the crystal phase of nitrides of the Group 6b of periodic table may often exist at a rate of not larger than 20 atomic %. When the element is oxygen, in particular, some part of oxygen that is not solid-dissolved in the crystals forms a phase composed of an aluminum oxide or an aluminum oxynitride, and may exist at a rate of not larger than 12 atomic %. Furthermore, due to the solid-dissolution of the element of the Group 6b of periodic table, the crystal of aluminum nitride exhibits lattice constants over a range which is shifted from those of the non-doped aluminum nitride by 0.003 to 0.015 angstroms on the a-axis, and by 0.004 to 0.021 angstroms on the c-axis, which are obviously different from the lattice constants (3.120 angstroms on the a-axis and 4.994 angstroms on the c-axis) of the non-doped aluminum nitride single crystal.

Being constituted as described above, the ceramic resistor of this aspect of the invention exhibits a volume resistivity of not larger than $10^{14}$ Ω-cm at 25° C. When doped with oxygen, the lower-limit value is about 10 Ω-cm and when doped with other element of the Group 6b of periodic table, the lower-limit value is about $10^9$ Ω-cm.

Besides, the resistor exhibits excellently stable resistivity; i.e., permits the resistivity to be varied by not more than three order of magnitude relative to the value at 25° C. over a temperature range of from 25° C. up to 300° C. In other words, when the volume resistivity at 25° C. is designated $R_{25°C.}$ and the volume resistivity at 300° C. is designated $R_{300°C.}$ the following formula is satisfied;

$$|log_{10}(R_{25°C.})-log_{10}(R_{300°C.})|\leq 3$$

There is no particular limitation on the method of producing the ceramic resistor of this aspect of the present invention so far as the above-mentioned constitution is satisfied. From the standpoint of easiness, however, a vapor-phase deposition method is desired. Concretely speaking, it can be formed by a physical vapor-phase deposition method (PVD method) such as sputtering, ion plating, etc. and chemical vapor-phase deposition method (CVD method) such as plasma CVD, photo or laser CVD, MO (metal-organic) CVD, etc. Among them, the CVD method is desired. According to these film-forming methods, there can be synthesized an aluminum nitride in which an element of the Group 6b of periodic table is solid-dissolved in an excess amount, and there can be obtained a ceramic resistor exhibiting different lattice constants due to aluminum nitride crystals that contain the element of the Group 6b of periodic table in an amount of from 0.005 to 20 atomic % as contemplated by the present invention.

When oxygen is used as the element of the Group 6b of periodic table, the ceramic resistor can be prepared by the CVD method by using an $N_2$ gas, an $NH_3$ gas, an $NO_2$ gas and an $AlCl_3$ gas as starting gases, flowing these gases at ratios of $N_2/AlCl_3=5$ to 70, $NO_2/NH_3=0.001$ to 1, and $NH_3/AlCl_3=0.1$ to 10, and setting the film-forming temperature at a value which is relatively as high as 850° C. or more.

When S (sulfur) is used as the element of the Group 6b of periodic table, the ceramic resistor can be prepared by the CVD method by using an $N_2$ gas, an $NH_3$ gas, an $H_2S$ gas and an $AlCl_3$ gas as starting gases, flowing these gases at ratios of $N_2/AlCl_3=5$ to 70, $H_2S/NH_3=0.001$ to 5, and $NH_3/AlCl_3=0.1$ to 10, and setting the film-forming temperature at a value which is relatively as high as 850° C. or more. It is also allowable to use a halide such as $AlBr_3$ or the like and an organometal such as trimethyl aluminum or the like, instead of $AlCl_3$.

Other examples of gas containing the element of the Group 6b of periodic table include $H_2Se$, $Se(CH_3)_2$, $Se(C_2H_5)$, $H_2Te$, $Te(CH_3)_2$, $Te(C_2H_5)_2$ and the like.

Any substrate can be used for forming a film. Concrete examples include $Al_2O_3$, AlON, $Si_3N_4$, diamond, mullite, $ZrO_2$, W, Mo, Mo-Mn, TiN, SiC, WC, carbon and Si semiconductor material (n-type or p-type). Among them, the most desirable example is a sintered product comprising chiefly aluminum nitride or the one having a coefficient of thermal expansion of from 4.0 to $8.0\times10^{-6}/°C.$ and, particularly, from 5 to $7.5\times10^{-6}/°C.$ over a temperature range of from room temperature to 800° C. from the standpoint of adhesiveness to the AlN film.

The aluminum nitride is a highly insulating material having a volume resistivity of, usually, not smaller than $10^{14}$ $\Omega$-cm. If, for example, oxygen is solid-dissolved in the aluminum nitride crystals to substitute oxygen for nitrogen, the electrons become in excess by a number of one presumably contributing to increasing the electrically conducting property and hence to increasing the electric conductivity of crystals.

Solid-dissolution of oxygen in the aluminum nitride crystals can be judged from changes in the lattice constants.

The aluminum nitride without containing oxygen has lattice constants of 3.120 angstroms on the a-axis and 4.994 angstroms on the c-axis. When oxygen atoms are solid-dissolved, however, the lattice constants decreases on both the a-axis and the c-axis. When the shifted amounts of lattice constants are set to be 0.003 to 0.015 angstroms on the a-axis and 0.004 to 0.021 angstroms on the c-axis, the volume resistivity can be suppressed to be not larger than 10–14 $\Omega$-cm.

Even when other element of the Group 6b of periodic table is solid-dissolved to substitute the element for aluminum or nitrogen, the element works as a donor or acceptor to increase electrically conducting property and, hence to, enhance electric conductivity of crystals.

Besides the resistor that is obtained exhibits a small change in the resistivity with a change in the temperature. In the case of the aluminum nitride, in general, the resistivity changes from $10^{16}$ $\Omega$-cm to $10^{10}$ $\Omega$-cm over a temperature range of from room temperature (25° C.) to 400° C. With the resistor doped with oxygen of the present invention, on the other hand, the resistance changes by not more than three order of magnitude, i.e., changes from $10^{13}$ $\Omega$-cm to $10^{11}$ $\Omega$-cm. In other words, when the volume resistivity at 25° C. is designated as $R_{25°C.}$ and the volume resistivity at 300° C. is designated as $R_{300°C.}$ the following formula is satisfied;

$$|log_{10}(R_{25°C.})-log_{10}(R_{300°C.})|\leq 3$$

Even with the resistor doped with other element of the Group 6b of periodic table, the resistance changes by not more than three order of magnitude, i.e., changes from $10^{12}$ $\Omega$-cm to $10^{10}$ $\Omega$-cm over a temperature range of from room temperature to 300° C. (the volume resistivity of the aluminum nitride at 300° C. is about $10^{12}$ $\Omega$-cm). Besides, the resistor maintains a volume resistivity which changes little even at a temperature as low as −50° C.

The resistor according to the second aspect of the present invention is doped with an element of the Group 2b of periodic table in an amount of from 0.005 to 25 atomic %, the lattice constants of the aluminum nitride crystal phase being shifted by 0.003 to 0.025 angstroms on the a-axis and by 0.005 to 0.050 angstroms on the c-axis from the lattice constants of the non-doped aluminum nitride single phase.

The element of the Group 2b of periodic table is an important element for imparting electrically conducting property to the aluminum nitride. When the amount of this element is smaller than 0.005 atomic %, the desired resistivity is not obtained and when the amount of this element exceeds 25 atomic %, other crystal phase tends to build up making it difficult to control the resistivity and permitting a thin film thereof to be peeled off or cracked. Concretely speaking, the elements of the Group 2b of periodic table include Zn, Cd and Hg. Among them, Zn and Cd are desirable from the standpoint of film-forming property.

From the standpoint of structure, the ceramic resistor comprises chiefly crystals of aluminum nitride and wherein the element of the Group 2b of periodic table partly solid-dissolves in the crystals of aluminum nitride. Due to some part of the element of the Group 2b of periodic table that is not solid-dissolved in the crystals, however, the crystal phase of nitrides of the Group 2b of periodic table may often exist at a rate of not larger than 20 atomic %. Furthermore, due to the solid-dissolution of the element of the Group 2b of periodic table, the crystal of aluminum nitride exhibits lattice constants over a range shifted from those of the aluminum nitride by 0.003 to 0.025 angstroms on the a-axis, and by 0.005 to 0.050 angstroms on the c-axis, which are obviously different from the lattice constants (3.120 angstroms on the a-axis and 4.994 angstroms on the c-axis) of the non-doped aluminum nitride single crystal.

Being constituted as described above, the ceramic resistor of this aspect of the invention exhibits a volume resistivity of not larger than $10^{14}$ Ω-cm at 25° C. and a lower-limit value of $10^6$ Ω-cm as confirmed by experiment. Besides, as will become obvious from Examples appearing later, the resistor exhibits excellently stable resistivity: i.e., permits the resistivity to vary by not more than three order of magnitude over a temperature range of from 25° C. up to 300° C. In other words, when the volume resistivity at 25° C. is designated as $R_{25° C.}$ and the volume resistivity at 300° C. is designated as $R_{300° C.}$, the following formula is satisfied;

$$|\log_{10}(R_{25° C.}) - \log_{10}(R_{300° C.})| \leq 3$$

Even at a temperature of −100° C., the resistor exhibits the resistivity same as that at room temperature.

There is no particular limitation on the method of producing the ceramic resistor of this aspect of the present invention so far as the above-mentioned constitution is satisfied. From the standpoint of easiness, however, a vapor-phase deposition method is desired. Concretely speaking, it can be formed by a physical vapor-phase deposition method (PVD method) such as sputtering, ion plating, etc. and chemical vapor-phase deposition method (CVD method) such as plasma CVD, photo or laser CVD, MO (metal-organic) CVD, etc. Among them, the CVD method is desired. According to these film-forming methods, there can be synthesized an aluminum nitride in which an element of the Group 2b of periodic table is solid-dissolved in an excess amount, and there can be obtained a ceramic resistor exhibiting different lattice constants due to aluminum nitride crystals that contain the element of the Group 2b of periodic table in an amount of from 0.005 to 25 atomic % as contemplated by the present invention.

When Zn is used as the element of the Group 2b of periodic table, the ceramic resistor can be prepared by the CVD method by using an $N_2$ gas, an $NH_3$ gas, a $Zn(CH_3)_2$ gas and an $AlCl_3$ gas as starting gases, flowing these gases at ratios of $N_2/AlCl_3$=5 to 70, $Zn(CH_3)_2/NH_3$=0.001 to 5, and $NH_3/AlCl_3$=0.1 to 10, and setting the film-forming temperature at a value which is relatively as high as 850° C. or more. It is allowable to use a halide such as $AlBr_3$ or the like and an organometal such as trimethyl aluminum or the like, instead of $AlCl_3$.

Other examples of gas containing the element of the Group 2b of periodic table include $Zn(CH_3)_2$, $Zn(C_2H_5)_2$, $Cd(CH_3)_2$, $Cd(C_2H_5)_2$, $Hg(CH_3)_2$, and the like.

Any substrate can be used for forming a film. Concrete examples include $Al_2O_3$, AlON, $Si_3N_4$, diamond, mullite, $ZrO_2$, W, Mo, Mo-Mn, TiN, SiC, WC, carbon and Si semiconductor material (n-type or p-type). Among them, the most desirable examples are those having a coefficient of thermal expansion of from 4.0 to $8.0 \times 10^{-6}$/°C. and, particularly, from 5 to $7.5 \times 10^{-6}$/°C. over a temperature range of from room temperature to 800° C. from the standpoint of adhesiveness.

Even in the resistor of this aspect of the present invention, lattice constants are shifted on the a-axis and the c-axis as the element of the Group 2b of periodic table are solid-dissolved like the case of the resistor of the first aspect. By shifting the lattice constants by 0.003 to 0.025 angstroms on the a-axis and by 0.005 to 0.050 angstroms on the c-axis, then, the volume resistivity can be suppressed to be not larger than $10^{14}$ Ω-cm.

Besides, the resistivity changes little with a change in the temperature; i.e., the resistivity changes by not more than three order of magnitude, i.e., from $10^{12}$ Ω-cm to $10^{10}$ Ω-cm over a temperature range of from room temperature (25° C.) to 300° C.

The resistor according to the third aspect of the present invention is doped with an element of the Group 4b of periodic table in an amount of from 0.005 to 30 atomic %, the lattice constants of the aluminum nitride crystal phase being shifted from the lattice constants of the non-doped aluminum nitride single phase by 0.003 to 0.030 angstroms on the a-axis and by 0.004 to 0.080 angstroms on the c-axis.

The element of the Group 4b of periodic table is an important element for imparting electrically conducting property to the aluminum nitride. When the amount of this element is smaller than 0.005 atomic %, the desired resistivity is not obtained and when the amount of this element exceeds 30 atomic %, other crystal phase tends to build up making it difficult to control the resistivity and permitting a thin film thereof to be peeled off or cracked. Concretely speaking, the elements of the Group 4b of periodic table include C, Si, Ge, Sn and Pb. Among them, C and Si are desirable from the standpoint of film-forming property.

From the standpoint of structure, the ceramic resistor comprises chiefly crystals of aluminum nitride and wherein the element of the Group 4b of periodic table partly solid-dissolves in the crystals of aluminum nitride. Due to some part of the element of the Group 4b of periodic table that is not solid-dissolved in the crystals, however, the crystal phase of nitrides of the Group 4b of periodic table may often exist at a rate of not larger than 20 atomic %. Furthermore, due to the solid-dissolution of the element of the Group 4b of periodic table, the crystal of aluminum nitride has lattice constants over a range shifted from those of the aluminum nitride by 0.003 to 0.030 angstroms on the aaxis, and by 0.004 to 0.080 angstroms on the c-axis, which are obviously different from the lattice constants (3.120 angstroms on the a-axis and 4.994 angstroms on the c-axis) of the non-doped aluminum nitride single crystal.

Being constituted as described above, the ceramic resistor of this aspect of the invention exhibits a volume resistivity of not larger than $10^{14}$ Ω-cm at 25° C. and a lower-limit value of $10^5$ Ω-cm. Besides, as will become obvious from Examples appearing later, the resistor exhibits excellently stable resistivity; i.e., permits the resistivity to vary by not more than three order of magnitude over a temperature range of from room temperature up to 300° C. In other words, when the volume resistivity at 25° C. is designated as $R_{25° C.}$ and the volume resistivity at 300° C. is designated as $R_{300° C.}$, the following formula is satisfied;

$$|\log_{10}(R_{25° C.}) - \log_{10}(R_{300° C.})| \leq 3$$

Even at a temperature of −100° C., the resistor exhibits the resistivity same as that at room temperature.

There is no particular limitation on the method of producing the ceramic resistor of this aspect of the present invention so far as the above-mentioned constitution is satisfied. From the standpoint of easiness, however, a vapor-phase deposition method is desired. Concretely speaking, it can be formed by a physical vapor-phase deposition method (PVD method) such as sputtering, ion plating, etc. and chemical vapor-phase deposition method (CVD method) such as plasma CVD, photo or laser CVD, MO (metal-organic) CVD, etc. Among them, the CVD method is desired. According to these film-forming methods, there can be synthesized an aluminum nitride in which an element of the Group 4b of periodic table are solid-dissolved in an excess amount, and there can be obtained a ceramic resistor exhibiting different lattice constants due to aluminum nitride crystals that contain the element of the Group 4b of periodic table in an amount of from 0.005 to 30 atomic % as contemplated by the present invention.

When Si is used as the element of the Group 4b of periodic table, the ceramic resistor can be prepared by the CVD method by using an $N_2$ gas, an $NH_3$ gas, an $SiCl_4$ gas and an $AlCl_3$ gas as starting gases, flowing these gases at ratios of $N_2/AlCl_3=5$ to 70, $SiCl_4/NH_3=0.001$ to 3, and $NH_3/AlCl_3=0.1$ to 10, and setting the film-forming temperature at a value which is relatively as high as 850° C. or more. It is also allowable to use $SiHCl_3$, $SiH_2Cl_2$, $SiH_4$, $Si_2H_6$ or the like instead of $SiCl_4$, and to use a halide such as $AlBr_3$ or the like and an organoaluminum such as trimethyl aluminum or the like, instead of $AlCl_3$.

Any substrate can be used for forming a film. Concrete examples include $Al_2O_3$, AlON, $Si_3N_4$, diamond, mullite, $ZrO_2$, W, Mo, Mo-Mn, TiN, SiC, WC, carbon and Si semiconductor material (n-type or p-type). Among them, it is most desired to use a sintered product comprising chiefly aluminum nitride from the standpoint of adhesiveness.

Even in the resistor of this aspect of the present invention, lattice constants are shifted on the a-axis and the c-axis as the element of the Group 4b of periodic table is solid-dissolved like the cases of the resistors of the first and second aspects. By shifting the lattice constants by 0.003 to 0.030 angstroms on the a-axis and by 0.004 to 0.080 angstroms on the c-axis toward either the larger side or the smaller side, then, the volume resistivity can be suppressed to be not larger than $10^{14}$ Ω-cm.

Besides, the resistance changes little with a change in the temperature; i.e., the resistivity changes by not more than three order of magnitude, i.e., from $10^{13}$ Ω-cm to $10^{11}$ Ω-cm over a temperature range of from room temperature (25° C.) to 300° C. In other words, when the volume resistivity at 25° C. is designated as $R_{25° C.}$ and the volume resistivity at 300° C. is designated as $R_{300° C.}$ the following formula is satisfied;

$$\log_{10}(R_{25° C.}) - \log_{10}(R_{300° C.}) \leq 3$$

Moreover, even at a temperature of as low as −100° C. the resistor maintains a volume resistivity which changes little.

The electrostatic chuck of the present invention will now be described in detail.

The feature of the electrostatic chuck of the present invention resides in that a resistor of the present invention having a volume resistivity within a range of from $10^7$ to $10^{13}$ Ω-cm is provided as a ceramic resistor layer on the surface of the substrate which has an electrode.

FIG. 1 illustrates an electrostatic chuck according to the present invention. The electrostatic chuck shown in FIG. 1 comprises an electrode layer 2 formed on the surface of a substrate 1 composed of an insulator having a volume resistivity of not smaller than $10^{14}$ Ω-cm at room temperature, the electrode layer 2 being impressed with a voltage, and a thin layer 3 composed of a ceramic resistor (hereinafter referred to as ceramic resistor layer) formed on the electrode layer 2. The ceramic resistor layer 3 is formed on at least the surface for placing a silicon wafer 4 or on the whole surfaces of the substrate exposed into the apparatus for producing semiconductors. The substrate 1 may contain a heater 5 as shown in FIG. 1, or a passage for flowing a coolant may be formed therein to cool the electrostatic chuck.

According to the present invention, the ceramic resistor layer 3 comprises chiefly an aluminum nitride crystal phase which is doped with at least one kind of element selected from the group consisting of elements of the Groups 2b, 4b and 6b of periodic table in a predetermined amount. Concretely speaking, the ceramic resistor layer comprises chiefly an aluminum nitride crystal phase which is doped with oxygen in an amount of from 0.01 to 20 atomic %, the aluminum nitride crystal phase having lattice constants that are shifted from the lattice constants of the aluminum nitride single phase by 0.004 to 0.013 angstroms on the a-axis and by 0.005 to 0.018 angstroms on the c-axis, i.e., the doped aluminum nitride crystals having lattice constants within ranges of from 3.107 to 3.116 angstroms on the a-axis and from 4.976 to 4.989 angstroms on the c-axis. Or, the ceramic resistor layer comprises chiefly an aluminum nitride crystal phase which is doped with an element of the Group 6b of periodic table in an amount of from 0.01 to 20 atomic %, and having lattice constants that are shifted by 0.004 to 0.013 angstroms on the a-axis and by 0.005 to 0.018 angstroms on the c-axis. Or, the ceramic resistor layer comprises chiefly an aluminum nitride crystal phase which is doped with an element of the Group 2b of periodic table in an amount of from 0.01 to 20 atomic %, and having lattice constants that are shifted by 0.003 to 0.020 angstroms on the a-axis and by 0.005 to 0.040 angstroms on the c-axis. Or the ceramic resistor layer comprises chiefly an aluminum nitride crystal phase which is doped with an element of the Group 4b of periodic table in an amount of from 0.01 to 25 atomic %, and having lattice constants that are shifted by 0.004 to 0.025 angstroms on the a-axis and by 0.005 to 0.050 angstroms on the c-axis.

When the aluminum nitride crystal constituting the ceramic resistor layer exhibits lattice constants that are shifted by amounts in excess of the above-mentioned ranges, it becomes no longer possible to suppress the volume resistivity (25° C. ) to lie within a range of from $10^7$ to $10^{13}$ Ω-cm.

Concerning properties of the electrostatic chuck, the leakage current increases when the resistivity of the ceramic resistor layer is smaller than $1 \times 10^7$ Ω-cm, and the absorbing force remains when the resistivity of the ceramic resistor layer is larger than $1 \times 10^{13}$ Ω-cm. Therefore, the ceramic resistor layer must have a volume resistivity that lies within a range of from $1 \times 10^7$ Ω-cm to $1 \times 10^{13}$ Ω-cm over a temperature range in which the electrostatic chuck is used, i.e., over a range of from 25° C. to 300° C. By taking the leakage current and response to the applied voltage into consideration, however, the volume resistivity should range from $1 \times 10^8$ to $5 \times 10^{12}$ Ω-cm. By taking the breakdown voltage into consideration, furthermore, the volume resistivity should most desirably be from $1 \times 10^9$ to $5 \times 10^{11}$ Ω-cm. A change in the volume resistivity has a correlation to the lattice constants. In the case of the resistor layer doped with oxygen, for example, the lattice constants should be controlled as shown in the following Table 1 to obtain resistivities.

TABLE 1

| Volume resistivity | Latteice constants (Å) | |
|---|---|---|
| (Ω- cm) | a-axis | c-axis |
| $1 \times 10^7 \sim 1 \times 10^{13}$ | 0.004 ~ 0.013 | 0.006 ~ 0.018 |
| $1 \times 10^8 \sim 1 \times 10^{12}$ | 0.005 ~ 0.012 | 0.007 ~ 0.016 |
| $1 \times 10^9 \sim 1 \times 10^{11}$ | 0.006 ~ 0.011 | 0.01 ~ 0.015 |

That is, in the resistor layer doped with oxygen, when the shifted amount of lattice constants is smaller than 0.004 angstroms on the a-axis and is smaller than 0.005 angstroms on the c-axis, then the carrier concentration that contributes to electric conduction becomes small, and the volume resistivity suddenly changes with a change in the temperature making it difficult to obtain stable electrostatically absorbing property. When the shifted amount of lattice constants exceed 0.013 angstroms on the a-axis and exceed 0.018 angstroms on the c-axis, the resistivity becomes so small that the electrostatic chuck permits a large current to leak and becomes no longer practicable.

In order to obtain stable operation, furthermore, the volume resistivity of the electrostatic chuck should change by not more than three order of magnitude and, preferably, by not more than two order of magnitude over a temperature range in which it is used, e.g., over a temperature range of from 25° C. to 300° C. More preferably, the volume resistivity should change by not more than three order of magnitude over a temperature range of from 25° C. to 300° C., and the resistivity should change as small as possible even at low temperatures of down to −100° C. According to the present invention, the ceramic resistor layer of the electrostatic chuck can be easily formed by the same method as that of forming the aforementioned ceramic resistor, for example, by the vapor-phase deposition method.

Concretely speaking, the ceramic resistor layer can be formed by a physical vapor-phase deposition method (PVD method) such as sputtering, ion plating, etc. and chemical vapor-phase deposition method (CVD method) such as plasma CVD, photo or laser CVD, MO (metal-organic) CVD, etc. Among them, the CVD method is desired.

Though there is no particular limitation on the substrate for forming the ceramic resistor layer, there can be exemplified a ceramic material comprising chiefly $Al_2O_3$, AlON, $Si_3N_4$, diamond, mullite, $ZrO_2$ or carbon based materials such as graphite. Among them, a sintered product comprising chiefly aluminum nitride is most desired because of its excellent resistance against plasma at the time of producing semiconductors.

Any known metal can be used as the electrode layer 2 to which the voltage will be applied. For instance, any one of W, Mo, Mo-Mn or Ag can be used. Moreover, the electrically conducting ceramic material such as TiN, SiC, WC, carbon or Si semiconductor material (n-type or p-type) can be used as the electrode material. Further, there may not exist the electrode layer 2, and the substrate itself may serve as an electrode. In such a case, the substrate 1 should be made of electrically conducting ceramics comprising chiefly SiC, TiN, WC or carbon based material such as graphite, or a simple metal such as W or Mo, or an alloy thereof and particularly, graphite, Mo or Mo based alloy is preferred. In this case, a voltage is applied directly to the electrically conducting substrate to generate static electricity. When the substrate incorporates the heater, there will be used Mo, W, Mo-Mn, TiC or TiN as the heater material.

In order to electrostatically absorb the silicon wafer by using the thus constituted electrostatic chuck, a voltage of about 0.2 to 2.0 KV is applied to the electrode layer 2 or to the electrically conducting substrate 1.

Surface of the ceramic resister layer may be flat, however, it is preferred that the grooves, as shown in FIG. 1, is formed in the surface of the layer in order to enhance absorbing capability to silicon wafers.

According to the present invention, the electrostatic chuck does not have any particularly complex structure but is realized in a simple structure at a reduced cost by using the material of the present invention, and can be used over a wide temperature region. Moreover, the apparatus itself can be simply constructed by incorporating the electrostatic chuck of the invention inclusive of electric circuit thereof, and the electrostatic chuck guarantees improved reliability and stable operation for extended periods of time.

EXAMPLES (Example 1)

An AlN film was formed on the surface of a substrate composed of a sintered product of aluminum nitride by the chemical vapor-phase deposition method. The AlN film was formed by introducing the substrate into a furnace, heating the substrate at 900° C. externally, feeding nitrogen at a flow rate of 8 SLM (Standard Litter per Minute), ammonia at a flow rate of 1 SLM, and feeding an $N_2O$ gas, dry air and waver vapor ($H_2O$) at flow rates of from 0 to 500 SCCM (Standart CC per Minute) under a pressure of 40 Torr. Then, aluminum chloride ($AlCl_3$) was introduced at a flow rate of 0.3 SLM to start the reaction thereby to form the film having a thickness of 450 μm. The lattice constants are calcurated by the peak-top method using X-ray diffraction peaks as follows: (100), (002), (101), (102), (110), (103), (112) and (004). The obtained angles are calibrated using Si (SRM640b) sample as control.

Furthermore, an alloy of Mo and Mn was metallized as an electrode layer on the surface of the substrate composed of a sintered product of aluminum nitride, and the AlN films shown in Table 2 were formed as resistor layers maintaining a thickness of 400 μm by the chemical vapor-phase deposition method on the surface of the substrate having the electrode as shown in FIG. 1.

The surface of the ceramic resistor layer after vapor-phase deposited was so polished that the surface coarseness Ra was 0.02 mm, and the absorbing force of the electrostatic chuck of when a voltage of 400 V was applied to the electrode and residual absorbing force of just after the voltage that had been applied for 30 minutes was interrupted were measured in vacuum. A change in the absorbing force was also measured over a temperature range of from room temperature to 300° C. and those exhibiting a change of not larger than 10% were evaluated to be good and those exhibiting a change of larger than 10% were evaluated to be bad. The results were as shown in Table 2.

TABLE 2

| Sample No. | (Oxygen) | | | | | | | | | | | |
|---|---|---|---|---|---|---|---|---|---|---|---|---|
| | Kind of gas | flow rate (sccm) | Amount of oxygen (atm %) | Shifted amount of lattice constants | | Volume resistivity (Ω-cm) | | | Absorbing force when 400 V is applied (g/cm²) | Stability (25° C.– 300° C.) | presence of residual absorbing force | Remarks |
| | | | | a-axis | c-axis | 25° C. | 300° C.) | 400° C. | | | | |
| *1 | — | — | 0.0001 | 0 | 0 | $9.0 \times 10^{15}$ | $1.1 \times 10^{11}$ | $1.2 \times 10^{10}$ | 12 | bad | yes | |
| 2 | $N_2O$ | 5 | 0.005 | 0.002 | 0.004 | $8.8 \times 10^{13}$ | $6.7 \times 10^{12}$ | $6.3 \times 10^{12}$ | 56 | bad | yes | |
| 3 | $N_2O$ | 10 | 0.07 | 0.005 | 0.009 | $1.2 \times 10^{12}$ | $9.8 \times 10^{11}$ | $7.9 \times 10^{11}$ | 124 | good | no | |

TABLE 2-continued (Oxygen)

| Sample No. | Kind of gas | flow rate (sccm) | Amount of oxygen (atm %) | Shifted amount of lattice constants | | Volume resistivity (Ω-cm) | | | Absorbing force when 400 V is applied (g/cm$^2$) | Stability (25° C.– 300° C.) | presence of residual absorbing force | Remarks |
|---|---|---|---|---|---|---|---|---|---|---|---|---|
| | | | | a-axis | c-axis | 25° C. | 300° C.) | 400° C. | | | | |
| 4 | N$_2$O | 20 | 0.06 | 0.007 | 0.012 | 9.6 × 10$^{10}$ | 7.1 × 10$^8$ | 4.2 × 10$^8$ | 152 | good | no | |
| 5 | N$_2$O | 30 | 1.2 | 0.010 | 0.014 | 7.8 × 10$^9$ | 7.2 × 10$^7$ | 5.5 × 10$^7$ | 137 | good | no | |
| 6 | N$_2$O | 40 | 4.0 | 0.012 | 0.016 | 1.3 × 10$^8$ | 1.5 × 10$^8$ | 2.0 × 10$^8$ | 140 | good | no | |
| 7 | N$_2$O | 50 | 7.2 | 0.014 | 0.019 | 4.5 × 10$^8$ | 2.4 × 10$^5$ | 9.1 × 10$^4$ | 0 | — | — | |
| 8 | N$_2$O | 100 | 18.1 | 0.015 | 0.021 | 3.0 × 10$^1$ | 2.6 × 10$^1$ | 2.5 × 10$^1$ | 0 | — | — | |
| *9 | N$_2$O | 200 | 24.0 | — | — | — | — | — | — | — | — | peeled |
| 10 | H$_2$O | 10 | 0.05 | 0.007 | 0.006 | 1.2 × 10$^{11}$ | 3.1 × 10$^{10}$ | 7.3 × 10$^9$ | 144 | good | no | |
| 11 | H$_2$O | 20 | 0.07 | 0.009 | 0.009 | 6.1 × 10$^9$ | 5.7 × 10$^9$ | 5.7 × 10$^9$ | 137 | good | no | |
| 12 | H$_2$O | 30 | 0.10 | 0.010 | 0.012 | 2.4 × 10$^9$ | 1.9 × 10$^8$ | 9.4 × 10$^7$ | 141 | good | no | |
| 13 | Air | 50 | 8.5 | 0.106 | 0.011 | 3.2 × 10$^{11}$ | 2.0 × 10$^{11}$ | 1.1 × 10$^{11}$ | 129 | good | no | |
| 14 | Air | 100 | 14.6 | 0.010 | 0.015 | 1.7 × 10$^{10}$ | 4.4 × 10$^9$ | 2.3 × 10$^9$ | 136 | good | no | |
| 15 | Air | 200 | 18.1 | 0.012 | 0.017 | 9.2 × 10$^7$ | 1.0 × 10$^8$ | 1.6 × 10$^8$ | 132 | good | no | |
| 16 | Air | 500 | 23.3 | — | — | — | — | — | — | — | — | peeled |

Samples marked with * lie outside the scope of the invention

As will be obvious from the results of Table 2, the amount of oxygen atoms in the aluminum nitride and lattice constants underwent changes depending upon the flow rate of the oxygen-containing gas. When the oxygen-containing gas was not introduced and the amount of oxygen atoms was of the impurity level of 0.0001 atomic %, the AlN film exhibited a highly insulating property having a volume resistivity of 9×10$^{15}$ Ω-cm. When the flow rate of the oxygen-containing gas was gradually increased, the amount of oxygen atoms increased in the film, and the lattice constants gradually decreased and the volume resistivity dropped to 30 Ω-cm (25° C.).

From the measurement of X-ray diffraction, the obtained aluminum nitride film had been (002) oriented. Observation by using a transmission-type electron microscope, however, revealed the existence of the alumina crystal phase, the amount thereof being correlated to the flow rate of the oxygen-containing gas. There were further found crystal phases in which aluminum, oxygen and nitrogen were detected.

Figure 2:
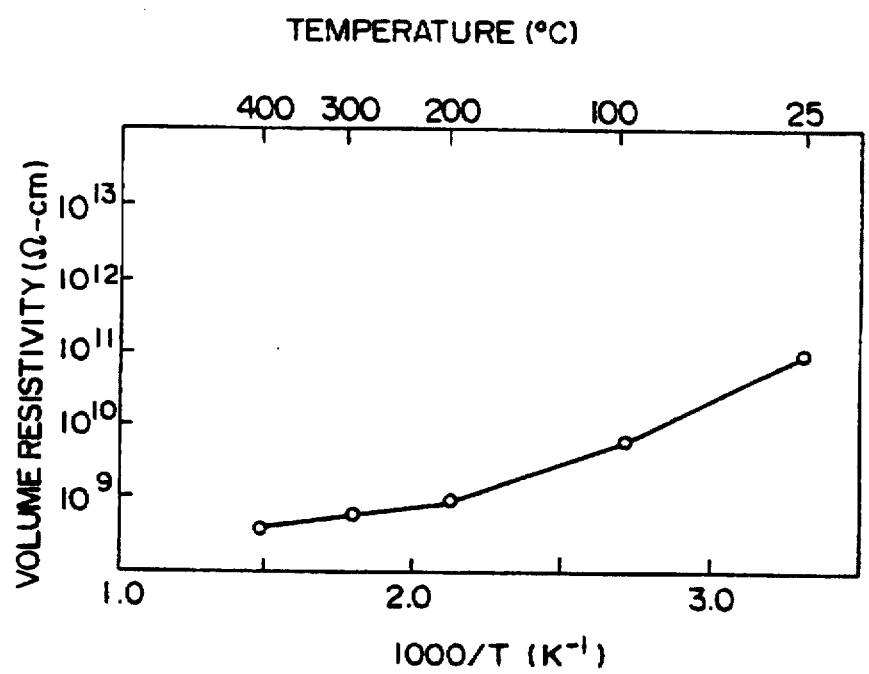
FIG. 2 is a diagram illustrating the temperature dependency of volume resistivity of a ceramic resistor layer of the present invention which is doped with oxygen.
Figure 6:
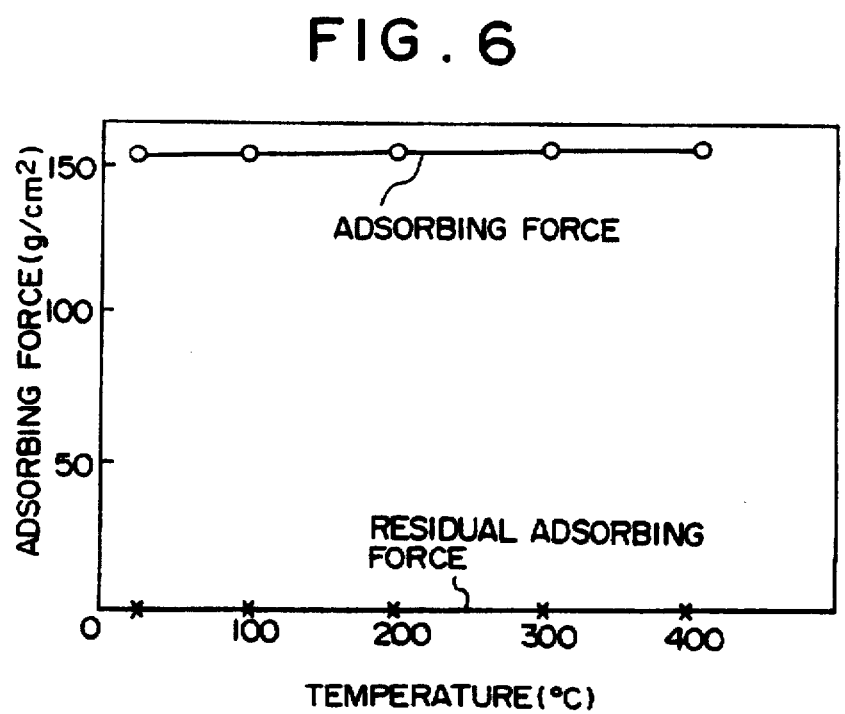
FIG. 6 is a diagram illustrating the temperature dependency of absorbing force of an electrostatic chuck of the present invention having the ceramic resistor layer doped with oxygen.

FIG. 2 shows the measured results of temperature dependency of volume resistivity of the sample No. 4, and FIG. 6 shows the measured results of temperature dependency of absorbing force thereof. As will be obvious from FIGS. 2 and 6, the volume resistivity is within a range of from 1×10$^{12}$ to 1.4×10$^{10}$ Ω-cm over a temperature range of from room temperature to 400° C. and the absorbing force remains almost constant and stable over the above temperature range. The samples Nos. 3 to 6 and 10 to 15 of Table 2 exhibited similarly stable absorbing properties, too.

In the case of the sample No. 1 using the AlN film which contained oxygen at an impurity level only, on the other hand, the volume resistivity abruptly changed from 10$^{16}$ Ω-cm to 10$^{10}$ Ω-cm as the temperature changed from 25° C. to 300° C., and the absorbing force was stabilized requiring extended periods of time at 150° C. and 200° C. and the residual absorbing force was observed, too.

(Example 2)

An AlN film was formed on the surface of a substrate composed of a sintered product of aluminum nitride by the chemical vapor-phase deposition method. The AlN film was formed by introducing the substrate into a furnace, heating the substrate at 900° C. externally, feeding nitrogen at a flow rate of 8 SLM, ammonia at a flow rate of 1 SLM, and feeding any one of H$_2$S, Se(CH$_3$)$_2$, H$_2$Se, H$_2$Te, or Te(CH$_3$)$_2$ at a flow rate of from 0 to 0.3 SLM under a pressure of 50 Torr. Then, aluminum chloride (AlCl$_3$) was introduced at a flow rate of 0.3 SLM to start the reaction thereby to form the film having a thickness of about 300 μm.

The obtained film was corrected for its angle by the X-ray diffraction method using Si (SRM640b) as a standard sample, and the lattice constants were calculated by the peak top method. Indexes of planes measured were (100), (002), (101), (102), (110), (103), (112) and (004).

Furthermore, like in Example 1, an alloy of Mo and Mn was metallized as an electrode layer on the surface of the substrate composed of a sintered product of aluminum nitride, and the AlN films shown in Table 3 were formed as resistor layers maintaining a thickness of 300 μm by the chemical vapor-phase deposition method on the surface of the substrate having the electrode.

The surface of the ceramic resistor layer after vapor-phase deposited was so polished that the surface coarseness Ra was 0.02 mm, and the absorbing force of the electrostatic chuck of when a voltage of 400 V was applied to the electrode and residual absorbing force of just after the voltage that had been applied for 30 minutes was interrupted were measured in vacuum. A change in the absorbing force was also measured over a temperature range of from room temperature to 400° C. and those exhibiting a change of not larger than 10% were evaluated to be good and those exhibiting a change of larger than 10% were evaluated to be bad.

TABLE 3

(Element of 6b group excepting oxygen)

| Sample No. | Kind of gas | flow rate (sccm) | Amount of 6b group element (atm %) | Shifted amount of lattice constants a-axis | Shifted amount of lattice constants c-axis | Volume resistivity (Ω-cm) −100° C. | Volume resistivity (Ω-cm) 0° C. | Volume resistivity (Ω-cm) 25° C. | Volume resistivity (Ω-cm) 300° C. | Absorbing force when 400 V is applied (g/cm²) | Stability (25° C.–300° C.) | presence of residual absorbing force | Remarks |
|---|---|---|---|---|---|---|---|---|---|---|---|---|---|
| *17 | — | — | 0.001 | 0 | 0 | $5.8 \times 10^{16}$ | $1.2 \times 10^{16}$ | $8.8 \times 10^{15}$ | $1.5 \times 10^{11}$ | 5 | bad | yes | |
| 18 | $H_2S$ | 1 | 0.005 | 0.003 | 0.004 | $3.1 \times 10^{14}$ | $2.0 \times 10^{13}$ | $8.9 \times 10^{12}$ | $7.7 \times 10^{12}$ | 11 | bad | yes | |
| 19 | $H_2S$ | 10 | 0.4 | 0.004 | 0.005 | $8.5 \times 10^{12}$ | $3.2 \times 10^{12}$ | $2.5 \times 10^{12}$ | $5.3 \times 10^{11}$ | 146 | good | no | |
| 20 | $H_2S$ | 20 | 0.9 | 0.004 | 0.006 | $7.4 \times 10^{12}$ | $6.3 \times 10^{11}$ | $5.8 \times 10^{11}$ | $9.3 \times 10^{10}$ | 146 | good | no | |
| 21 | $H_2S$ | 50 | 2.2 | 0.006 | 0.007 | $4.5 \times 10^{12}$ | $3.9 \times 10^{11}$ | $2.6 \times 10^{11}$ | $4.5 \times 10^{10}$ | 148 | good | no | |
| 22 | $H_2S$ | 100 | 18 | 0.010 | 0.015 | $1.2 \times 10^{11}$ | $9.3 \times 10^{10}$ | $9.2 \times 10^{10}$ | $1.7 \times 10^{10}$ | 150 | good | no | |
| *23 | $H_2S$ | 500 | 22.3 | 0.017 | 0.025 | — | — | — | — | — | — | — | peeled |
| 24 | $H_2Se$ | 10 | 1.4 | 0.003 | 0.004 | $4.0 \times 10^{12}$ | $8.7 \times 10^{11}$ | $8.3 \times 10^{11}$ | $6.2 \times 10^{10}$ | 141 | good | no | |
| 25 | $H_2Se$ | 20 | 2.5 | 0.004 | 0.005 | $2.5 \times 10^{12}$ | $8.5 \times 10^{11}$ | $8.3 \times 10^{11}$ | $6.0 \times 10^{10}$ | 146 | good | no | |
| 26 | $H_2Se$ | 50 | 7.0 | 0.006 | 0.007 | $3.2 \times 10^{12}$ | $2.2 \times 10^{12}$ | $2.1 \times 10^{12}$ | $1.8 \times 10^{10}$ | 150 | good | no | |
| 27 | $H_2Se$ | 50 | 7.0 | 0.004 | 0.007 | $3.3 \times 10^{12}$ | $2.1 \times 10^{12}$ | $2.1 \times 10^{12}$ | $1.8 \times 10^{10}$ | 149 | good | no | |
| 28 | $H_2Se$ | 100 | 19 | 0.010 | 0.016 | $8.9 \times 10^{11}$ | $1.5 \times 10^{11}$ | $1.2 \times 10^{11}$ | $4.5 \times 10^{10}$ | 159 | good | no | |
| *29 | $H_2Se$ | 400 | 29 | 0.018 | 0.026 | — | — | — | — | — | — | — | peeled |
| 30 | $Se(CH_3)_2$ | 5 | 0.009 | 0.003 | 0.004 | $1.3 \times 10^{14}$ | $3.2 \times 10^{12}$ | $1.5 \times 10^{12}$ | $8.5 \times 10^{10}$ | 51 | good | no | |
| 31 | $Se(CH_3)_2$ | 15 | 1.8 | 0.007 | 0.009 | $9.0 \times 10^{11}$ | $6.3 \times 10^{11}$ | $6.2 \times 10^{11}$ | $4.2 \times 10^{10}$ | 145 | good | no | |
| 32 | $Se(CH_3)_2$ | 20 | 1.9 | 0.006 | 0.008 | $8.0 \times 10^{11}$ | $6.2 \times 10^{11}$ | $5.3 \times 10^{11}$ | $3.2 \times 10^{10}$ | 149 | good | no | |
| 33 | $Se(CH_3)_2$ | 50 | 3.9 | 0.010 | 0.012 | $5.0 \times 10^{10}$ | $4.8 \times 10^{10}$ | $4.0 \times 10^{10}$ | $9.0 \times 10^{9}$ | 153 | good | no | |
| 34 | $Se(CH_3)_2$ | 60 | 4.2 | 0.011 | 0.016 | $6.0 \times 10^{9}$ | $4.7 \times 10^{9}$ | $4.7 \times 10^{9}$ | $4.5 \times 10^{9}$ | 154 | good | no | |
| 35 | $H_2Te$ | 10 | 1.3 | 0.004 | 0.005 | $9.3 \times 10^{12}$ | $2.1 \times 10^{12}$ | $9.9 \times 10^{11}$ | $9.2 \times 10^{11}$ | 142 | good | no | |
| 36 | $H_2Te$ | 20 | 2.6 | 0.006 | 0.009 | $7.8 \times 10^{12}$ | $1.2 \times 10^{11}$ | $9.9 \times 10^{11}$ | $9.2 \times 10^{11}$ | 151 | good | no | |
| 37 | $H_2Te$ | 50 | 10 | 0.009 | 0.013 | $2.9 \times 10^{12}$ | $9.5 \times 10^{11}$ | $9.3 \times 10^{11}$ | $9.1 \times 10^{11}$ | 147 | good | no | |
| 38 | $H_2Te$ | 55 | 11 | 0.006 | 0.008 | $3.5 \times 10^{12}$ | $9.6 \times 10^{11}$ | $9.3 \times 10^{11}$ | $9.1 \times 10^{11}$ | 149 | good | no | |
| 39 | $Te(CH_3)_2$ | 10 | 0.5 | 0.004 | 0.005 | $6.5 \times 10^{12}$ | $1.5 \times 10^{12}$ | $9.9 \times 10^{11}$ | $9.0 \times 10^{11}$ | 146 | good | no | |
| 40 | $Te(CH_3)_2$ | 30 | 3.5 | 0.006 | 0.008 | $3.2 \times 10^{12}$ | $9.8 \times 10^{11}$ | $9.2 \times 10^{11}$ | $9.0 \times 10^{11}$ | 153 | good | no | |

Samples marked with * lie outside the scope of the invention

As will be obvious from the results of Table 3, the amount of element of the Group 6b of periodic table in the aluminum nitride and lattice constants underwent changes depending upon the flow rate of the gas containing the element of the Group 6b of periodic table. When the gas containing element of the Group 6b of periodic table was not introduced and the amount of the element of the Group 6b of periodic table was of the impurity level of 0.0001 atomic %, the AlN film exhibited a highly insulating property having a volume resistivity of $8.8 \times 10^{12}$ Ω-cm. When the flow rate of the gas containing the element of the Group 6b of periodic table was gradually increased, the amount of the element of the Group 6b of periodic table increased in the film, and the lattice constants gradually decreased and the volume resistivity dropped to $4.7 \times 10^{9}$ Ω-cm (25° C. ). In the case of the samples Nos. 23 and 29 in which the amount of the element of the Group 6b exceeded 20 atomic %, however, the AlN film peeled. From the measurement of X-ray diffraction, the obtained aluminum nitride film had been (002) oriented.

Figure 3:
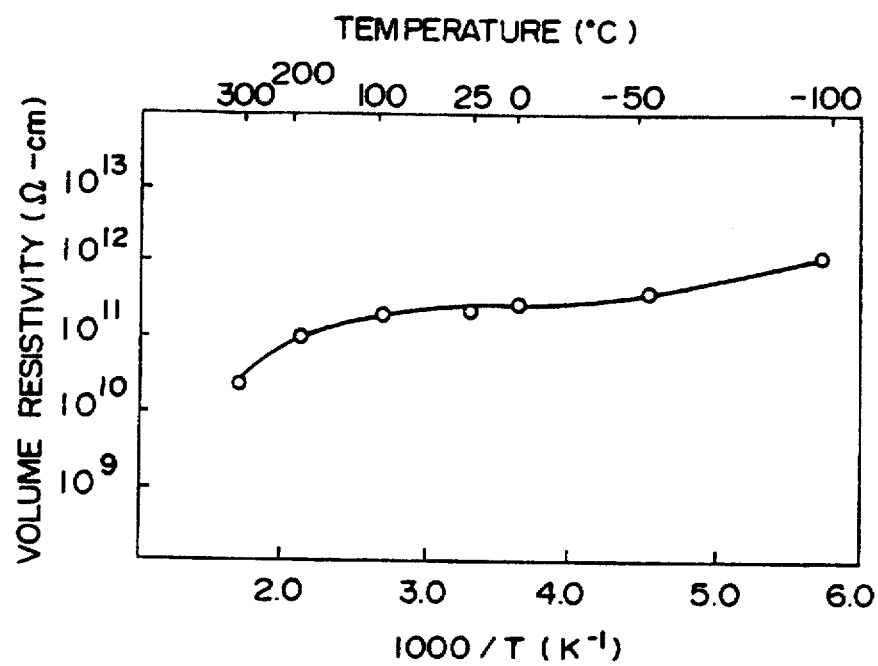
FIG. 3 is a diagram illustrating the temperature dependency of volume resistivity of the ceramic resistor layer of the present invention which is doped with an element (Si) of the Group 4b of periodic table.
Figure 7:
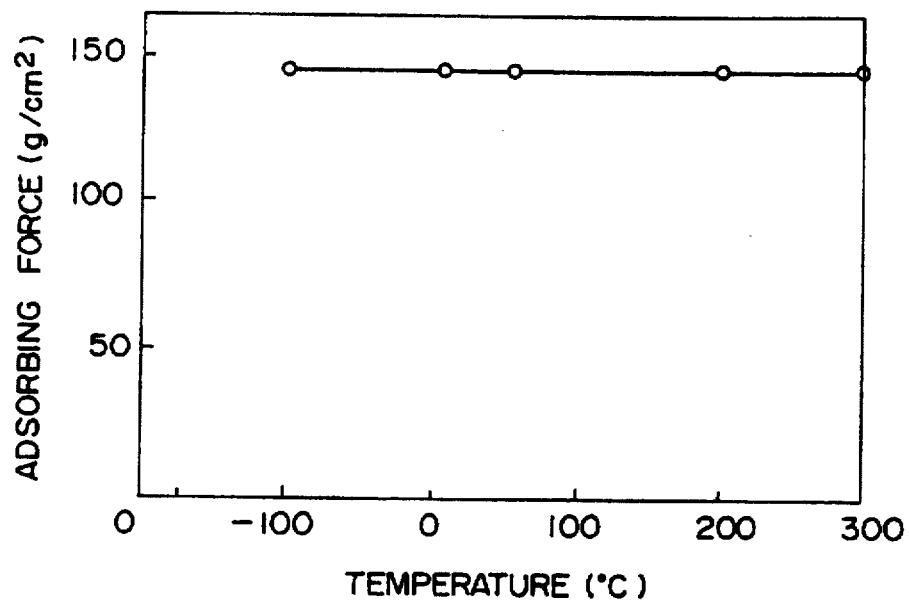
FIG. 7 is a diagram illustrating the temperature dependency of absorbing force of the electrostatic chuck of the present invention having the ceramic resistor layer doped with an element (S) of the Group 6b of periodic table.

FIG. 3 shows the measured results of temperature dependency of volume resistivity of the sample No. 21 and FIG. 7 shows the measured results of temperature dependency of absorbing force thereof. The samples Nos. 19, 20, 22, 24–28, and 30–40 of Table 3 exhibited stable resistivity and stable absorbing properties to FIG. 3 and FIG. 7.

According to the results of Table 3, FIG. 3 and FIG. 7, the samples containing the element of the Group 6b of periodic table in an amount of from 0.01 to 20 atomic % exhibited high and stable absorbing property over a temperature range of from room temperature to 300° C.

(Example 3)

An AlN film was formed on the surface of a substrate composed of a sintered product of aluminum nitride by the chemical vapor-phase deposition method. The AlN film was formed by introducing the substrate into a furnace, heating the substrate at 900° C. externally, feeding nitrogen at a flow rate of 8 SLM, ammonia at a flow rate of 1 SLM, and feeding a gas containing an element of the Group 2b of periodic table at a flow rate of from 0 to 0.5 SLM under a pressure of 50 Torr. Then, aluminum chloride ($AlCl_3$) was introduced at a flow rate of 0.3 SLM to start the reaction thereby to form the film having a thickness of 400 μm.

The obtained film was corrected for its angle by the X-ray diffraction method using Si (SRM640b) as a standard sample, and the lattice constants were calculated by the peak top method. The results were as shown in Table 4. Indexes of planes measured were (100), (002), (101), (102), (110), (103), (112) and (004).

Furthermore, an alloy of Mo and Mn was metallized as an electrode layer on the surface of the substrate composed of a sintered product of aluminum nitride, and the AlN films shown in Table 4 were formed as resistor layers maintaining a thickness of 400 μm by the chemical vapor-phase deposition method on the surface of the substrate having the electrode.

The surface of the ceramic resistor layer after vapor-phase deposited was so polished that the surface coarseness Ra was 0.02 mm, and the absorbing force of the electrostatic chuck of when a voltage of 400 V was applied to the electrode and residual absorbing force of just after the voltage that had been applied for 30 minutes was interrupted were measured in vacuum. A change in the absorbing force was also measured over a temperature range of from room temperature to 400° C. and those exhibiting a change of not larger than 10% were evaluated to be good and those exhibiting a change of larger than 10% were evaluated to be bad.

TABLE 4

(Element of 2b group)

| Sample No. | Kind of gas | flow rate (sccm) | Amount of 6b group element in AlN film (atm %) | Shifted amount of lattice constants a-axis | Shifted amount of lattice constants c-axis | Volume resistivity (Ω-cm) $-100°$ C. | Volume resistivity (Ω-cm) $0°$ C. | Volume resistivity (Ω-cm) $25°$ C. | Volume resistivity (Ω-cm) $300°$ C. | Absorbing force when 400 V is applied (g/cm$^2$) | presence of residual absorbing force | Stability ($25°$ C.– $300°$ C.) | Remarks |
|---|---|---|---|---|---|---|---|---|---|---|---|---|---|
| *41 | — | — | 0.0001 | 0 | 0 | $4.5 \times 10^{16}$ | $2.0 \times 10^{16}$ | $5.9 \times 10^{15}$ | $1.2 \times 10^{11}$ | 2 | yes | bad | |
| 42 | Zn(CH$_3$)$_2$ | 1 | 0.005 | 0.003 | 0.005 | $1.2 \times 10^{13}$ | $1.2 \times 10^{13}$ | $1.2 \times 10^{13}$ | $7.6 \times 10^{12}$ | 15 | no | bad | |
| 43 | Zn(CH$_3$)$_2$ | 5 | 0.1 | 0.006 | 0.008 | $7.2 \times 10^{11}$ | $6.4 \times 10^{11}$ | $6.2 \times 10^{11}$ | $6.0 \times 10^{11}$ | 148 | no | good | |
| 44 | Zn(CH$_3$)$_2$ | 10 | 0.4 | 0.008 | 0.011 | $6.0 \times 10^{10}$ | $3.9 \times 10^{10}$ | $3.7 \times 10^{10}$ | $3.5 \times 10^{10}$ | 150 | no | good | |
| 45 | Zn(CH$_3$)$_2$ | 20 | 0.9 | 0.010 | 0.013 | $2.1 \times 10^{9}$ | $7.9 \times 10^{9}$ | $9.5 \times 10^{9}$ | $6.4 \times 10^{9}$ | 154 | no | good | |
| 46 | Zn(CH$_3$)$_2$ | 60 | 3.6 | 0.014 | 0.020 | $1.4 \times 10^{9}$ | $8.0 \times 10^{8}$ | $7.6 \times 10^{8}$ | $7.5 \times 10^{8}$ | 155 | no | good | |
| 47 | Zn(CH$_3$)$_2$ | 140 | 19.0 | 0.019 | 0.039 | $6.8 \times 10^{7}$ | $6.8 \times 10^{7}$ | $6.8 \times 10^{7}$ | $6.9 \times 10^{7}$ | 153 | no | good | |
| 48 | Zn(CH$_3$)$_2$ | 100 | 10.2 | 0.017 | 0.030 | $1.1 \times 10^{8}$ | $3.1 \times 10^{8}$ | $3.3 \times 10^{8}$ | $1.2 \times 10^{8}$ | 151 | no | good | |
| 49 | Zn(CH$_3$)$_2$ | 150 | 19.7 | 0.021 | 0.040 | $6.8 \times 10^{7}$ | $6.8 \times 10^{7}$ | $6.8 \times 10^{7}$ | $6.9 \times 10^{7}$ | 155 | no | good | |
| 50 | Zn(CH$_3$)$_2$ | 200 | 24.0 | 0.026 | 0.052 | $3.5 \times 10^{6}$ | $1.3 \times 10^{6}$ | $1.2 \times 10^{6}$ | $1.0 \times 10^{6}$ | 69 | no | good | leaked current |
| *51 | Zn(CH$_3$)$_2$ | 500 | 30.0 | 0.030 | 0.071 | — | — | — | — | — | — | — | peeled |
| 52 | Cd(CH$_3$)$_2$ | 5 | 0.2 | 0.007 | 0.009 | $1.0 \times 10^{11}$ | $7.0 \times 10^{10}$ | $6.9 \times 10^{10}$ | $4.4 \times 10^{10}$ | 151 | no | good | |
| 53 | Cd(CH$_3$)$_2$ | 10 | 0.5 | 0.010 | 0.016 | $2.3 \times 10^{10}$ | $9.3 \times 10^{9}$ | $8.2 \times 10^{9}$ | $6.5 \times 10^{9}$ | 155 | no | good | |
| 54 | Cd(CH$_3$)$_2$ | 20 | 1.3 | 0.012 | 0.020 | $7.2 \times 10^{8}$ | $6.0 \times 10^{8}$ | $5.6 \times 10^{8}$ | $2.3 \times 10^{8}$ | 153 | no | good | |
| 55 | Cd(CH$_3$)$_2$ | 50 | 4.5 | 0.016 | 0.029 | $3.6 \times 10^{8}$ | $1.5 \times 10^{8}$ | $1.2 \times 10^{8}$ | $9.5 \times 10^{7}$ | 166 | no | good | |
| 56 | Hg(CH$_3$)$_2$ | 3 | 0.06 | 0.005 | 0.007 | $5.7 \times 10^{12}$ | $4.3 \times 10^{12}$ | $4.0 \times 10^{12}$ | $4.1 \times 10^{12}$ | 160 | no | good | |
| 57 | Hg(CH$_3$)$_2$ | 6 | 0.07 | 0.007 | 0.009 | $3.5 \times 10^{11}$ | $3.4 \times 10^{11}$ | $3.4 \times 10^{11}$ | $3.4 \times 10^{11}$ | 165 | no | good | |

Samples marked with * lie outside the scope of the invention

As will be obvious from the results of Table 4, the amount of element of the Group 2b of periodic table in the aluminum nitride and lattice constants underwent changes depending upon the flow rate of the gas containing the element of the Group 2b of periodic table. When the gas containing element of the Group 2b of periodic table was not introduced and the amount of the element of the Group 2b of periodic table was of the impurity level of 0.0001 atomic %, the AlN film exhibited a highly insulating property having a volume resistivity of $5.9 \times 10^{15}$ Ω-cm($25°$ C.). When the flow rate of the gas containing the element of the Group 2b of periodic table was gradually increased, the amount of the element of the Group 2b of periodic table increased in the film, and the lattice constants gradually decreased and the volume resistivity dropped to $1.2 \times 10^{6}$ Ω-cm($25°$ C.). From the measurement of X-ray diffraction, the obtained aluminum nitride film had been (002) oriented.

Figure 4:
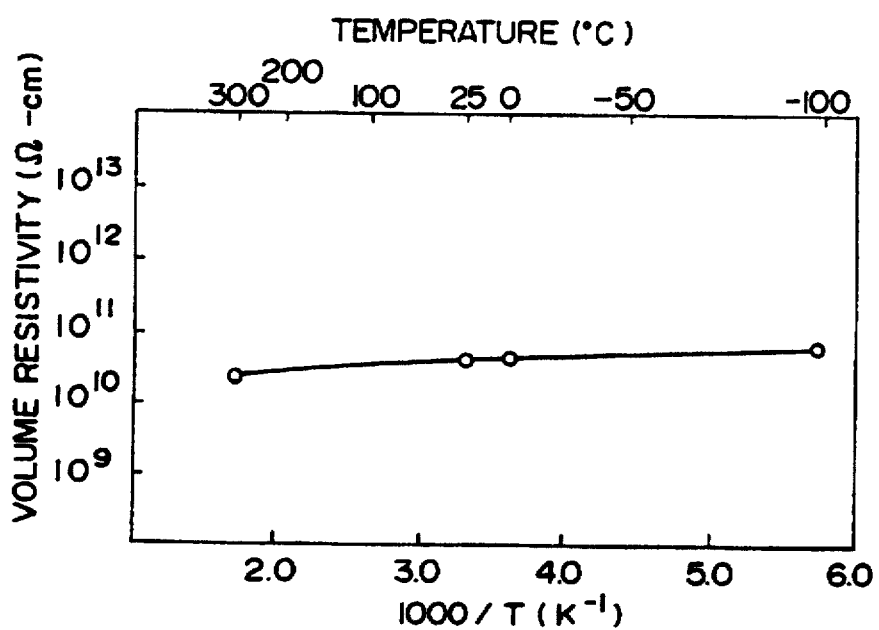
FIG. 4 is a diagram illustrating the temperature dependency of volume resistivity of the ceramic resistor layer of the present invention which is doped with an element (Zn) of the Group 2b of periodic table.
Figure 8:
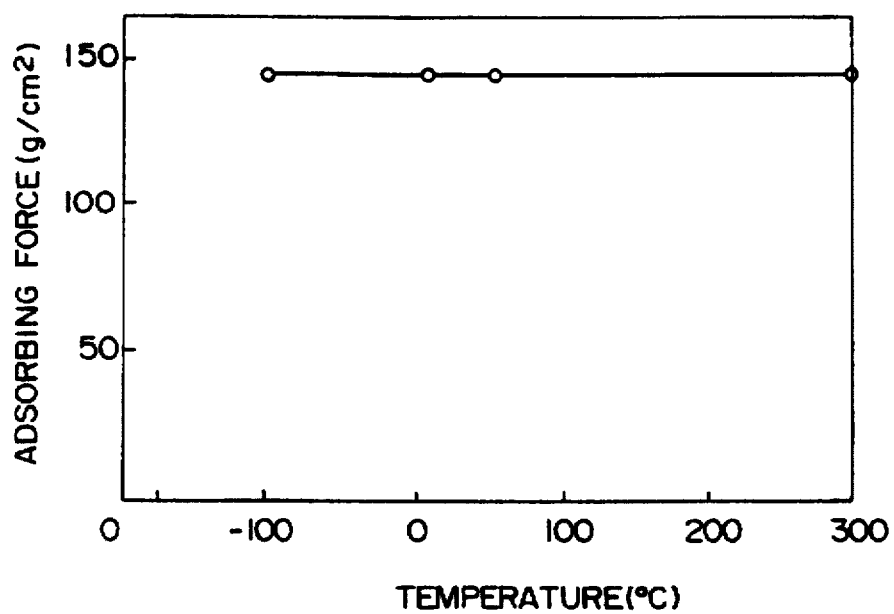
FIG. 8 is a diagram illustrating the temperature dependency of absorbing force of the electrostatic chuck of the present invention having the ceramic resistor layer doped with an element (Zn) of the Group 2b of periodic table.

FIG. 4 shows the measured results of temperature dependency of volume resistivity of the sample No. 44, and FIG. 8 shows the measured results of temperature dependency of absorbing force thereof. The samples Nos. 43, 45–49, and 52–57 of Table 4 exhibited stable resistivity and stable absorbing properties similarly to FIG. 4 and FIG. 8.

According to the results of Table 4, FIG. 4 and FIG. 8, the samples Nos. 43–49 and 52–57 containing the element of the Group 2b of periodic table in an amount of from 0.01 to 20 atomic % exhibited high and stable absorbing property over a temperature range of from room temperature to $300°$ C.

(Example 4)

An AlN film was formed on the surface of a substrate composed of a sintered product of aluminum nitride by the chemical vapor-phase deposition method. The AlN film was formed by introducing the substrate into a furnace, heating the substrate at $900°$ C. externally, feeding nitrogen at a flow rate of 8 SLM, ammonia at a flow rate of 1 SLM, and feeding an SiH$_4$, SiCl$_4$, CH$_4$, GeH$_4$, SnCl$_4$, or Pb(CH$_3$)$_4$ gas at a flow rate of from 10 to 1000 SCCM under a pressure of 50 Torr. Then, aluminum chloride (AlCl$_3$) was introduced at a flow rate of 0.3 SLM to start the reaction thereby to form the film having a thickness of 400 μm.

Figure 5:
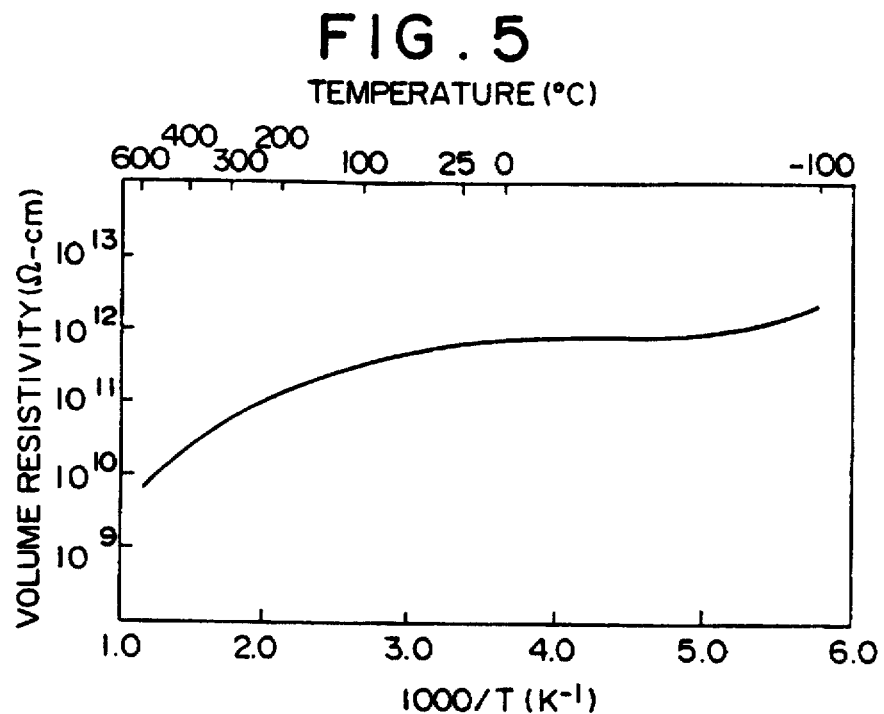
FIG. 5 is a diagram illustrating the temperature dependency of volume resistivity of the ceramic resistor layer of the present invention which is doped with an element (Si) of the Group 4b of periodic table.

The obtained film was corrected for its angle by the X-ray diffraction method using Si (SRM640b) as a standard sample, and the lattice constants were calculated by the peak top method. Indexes of planes measured were (100), (002), (101), (102), (110), (103), (112) and (004). Moreover, the volume resistivity was measured at $-100°$ C., at room temperature and at $300°$ C. The results were as shown in Table 5. FIG. 5 shows the volume resistivities of the samples Nos. 4 and 5 over a temperature range of from $-100°$ C. to $600°$ C. An alloy of Mo and Mn was metallized as an electrode layer on the surface of the substrate composed of a sintered product of aluminum nitride, and the AlN film was formed by the chemical vapor-phase deposition method on the surface of the substrate having the electrode. The AlN film was formed by introducing the substrate in the furnace, heating the substrate at $900°$ C. externally, flowing a nitrogen gas at a flow rate of 8 SLM and an ammonium gas at a flow rate of 1 SLM, that were maintained constant, flowing a gas containing an element of the Group 4b of periodic table at a flow rate that varied as shown in Table 5, and maintaining the pressure in the furnace at 40 Torr. Then, aluminum chloride (AlCl$_4$) was fed at a flow rate of 0.3 SLM to start the reaction thereby to obtain a ceramic resistor layer having a thickness of 400 μm. The obtained resistor layer was measured for its volume resistivity at $-100°$ C., $0°$ C., $25°$ C. and $300°$ C. The results were as shown in Table 5.

The surface of the ceramic resistor layer after vapor-phase deposited was so polished that the surface coarseness Ra was 0.02 mm, and the absorbing force of the electrostatic chuck at $25°$ C. of when a voltage of 400 V was applied to the electrode and residual absorbing force of Just after the voltage that had been applied for 30 minutes was interrupted were measured in vacuum. A change in the absorbing force was also measured over a temperature range of from $0°$ C. to $300°$ C. and those exhibiting a change of not larger than 10% were evaluated to be good and those exhibiting a change of larger than 10% were evaluated to be bad.

TABLE 5

(Element of 4b group)

| Sample No. | Kind of gas | flow rate (sccm) | Amount of 4b group element (atm %) | Shifted amount of lattice constants a-axis | Shifted amount of lattice constants c-axis | Volume resistivity ($\Omega$-cm) -100° C. | Volume resistivity ($\Omega$-cm) 0° C. | Volume resistivity ($\Omega$-cm) 25° C. | Volume resistivity ($\Omega$-cm) 300° C. | Absorbing force when 400 V is applied (g/cm$^2$) | presence of residual absorbing force | Stability (25° C.–300° C.) | Remarks |
|---|---|---|---|---|---|---|---|---|---|---|---|---|---|
| *58 | SiH$_4$ | 0 | 0.0001 | 0 | 0 | $4.5 \times 10^{16}$ | $1.0 \times 10^{16}$ | $9.0 \times 10^{15}$ | $1.2 \times 10^{11}$ | 3 | yes | bad | |
| 59 | SiH$_4$ | 10 | 0.01 | 0.004 | 0.005 | $9.8 \times 10^{12}$ | $7.7 \times 10^{12}$ | $7.2 \times 10^{12}$ | $3.5 \times 10^{12}$ | 146 | no | good | |
| 60 | SiH$_4$ | 50 | 0.1 | 0.008 | 0.013 | $5.1 \times 10^{10}$ | $3.4 \times 10^{10}$ | $3.0 \times 10^{10}$ | $2.5 \times 10^{10}$ | 141 | no | good | |
| 61 | SiCl$_4$ | 20 | 0.2 | 0.004 | 0.005 | $9.2 \times 10^{12}$ | $8.7 \times 10^{12}$ | $8.6 \times 10^{12}$ | $8.4 \times 10^{12}$ | 148 | no | good | |
| 62 | SiCl$_4$ | 30 | 0.4 | 0.004 | 0.006 | $8.0 \times 10^{12}$ | $7.0 \times 10^{12}$ | $7.1 \times 10^{12}$ | $6.2 \times 10^{12}$ | 155 | no | good | |
| 63 | SiCl$_4$ | 50 | 0.8 | 0.005 | 0.008 | $7.4 \times 10^{12}$ | $5.5 \times 10^{12}$ | $5.5 \times 10^{12}$ | $7.3 \times 10^{12}$ | 151 | no | good | |
| 64 | SiCl$_4$ | 100 | 3.5 | 0.007 | 0.015 | $1.5 \times 10^{12}$ | $7.0 \times 10^{11}$ | $6.4 \times 10^{11}$ | $7.8 \times 10^{10}$ | 147 | no | good | |
| 65 | SiCl$_4$ | 150 | 5.0 | 0.009 | 0.018 | $4.5 \times 10^{11}$ | $1.0 \times 10^{11}$ | $9.1 \times 10^{10}$ | $8.0 \times 10^{10}$ | 150 | no | good | |
| 66 | SiCl$_4$ | 200 | 7.6 | 0.010 | 0.022 | $3.5 \times 10^{10}$ | $2.2 \times 10^{10}$ | $2.2 \times 10^{10}$ | $6.9 \times 10^{8}$ | 159 | no | good | |
| 67 | SiCl$_4$ | 400 | 21.8 | 0.020 | 0.040 | $5.9 \times 10^{7}$ | $4.0 \times 10^{7}$ | $3.8 \times 10^{7}$ | $1.6 \times 10^{7}$ | 144 | no | good | |
| 68 | SiCl$_4$ | 500 | 26.7 | 0.027 | 0.070 | $1.6 \times 10^{5}$ | $2.0 \times 10^{5}$ | $2.5 \times 10^{5}$ | $9.7 \times 10^{4}$ | — | — | — | peeled |
| 69 | CH$_4$ | 100 | 0.03 | 0.006 | 0.012 | $5.4 \times 10^{11}$ | $5.1 \times 10^{11}$ | $5.0 \times 10^{11}$ | $6.6 \times 10^{10}$ | 159 | no | good | |
| 70 | CH$_4$ | 500 | 0.2 | 0.015 | 0.049 | $8.6 \times 10^{7}$ | $9.0 \times 10^{7}$ | $9.5 \times 10^{7}$ | $9.0 \times 10^{9}$ | 155 | no | good | |
| 71 | GeH$_4$ | 20 | 0.05 | 0.008 | 0.014 | $3.3 \times 10^{11}$ | $2.7 \times 10^{11}$ | $2.5 \times 10^{11}$ | $6.6 \times 10^{10}$ | 142 | no | good | |
| 72 | SnCl$_4$ | 100 | 2.0 | 0.016 | 0.035 | $1.0 \times 10^{10}$ | $9.0 \times 10^{9}$ | $8.9 \times 10^{9}$ | $9.0 \times 10^{9}$ | 153 | no | good | |
| 73 | Pb(CH$_3$)$_4$ | 10 | 0.1 | 0.007 | 0.016 | $5.9 \times 10^{11}$ | $4.0 \times 10^{11}$ | $3.0 \times 10^{11}$ | $2.7 \times 10^{11}$ | 148 | no | good | |

Samples marked with * lie outside the scope of the invention

As will be obvious from the results of Table 5, the amount of element of the Group 4b of periodic table in the resistor layer and lattice constants underwent changes depending upon the flow rate of the gas containing the element of the Group 4b of periodic table. When the gas containing the element of the Group 4b of periodic table was not introduced and the amount of the element of the Group 4b of periodic table was of the impurity level of 0.0001 atomic % (sample No. 58), the resistor layer exhibited a highly insulating property having a volume resistivity of $9 \times 10^{15}$ $\Omega$-cm (25° C.). When the flow rate of the gas containing the element of the Group 4b of periodic table was gradually increased, the amount of the element of the Group 4b of periodic table increased, and the volume resistivity dropped at room temperature. When the amount of the element of the Group 4b of periodic table was larger than 25 atomic % (sample No. 68), however, the volume resistivity became smaller than $10^7$ $\Omega$-cm, and the leakage current was so large that the absorbing force could not be measured.

From the measurement of X-ray diffraction, the obtained resistor layer had been (002) oriented. Furthermore, the presence of the silicon nitride crystal phase was confirmed in the film containing much Si in addition to the AlN phase.

Figure 9:
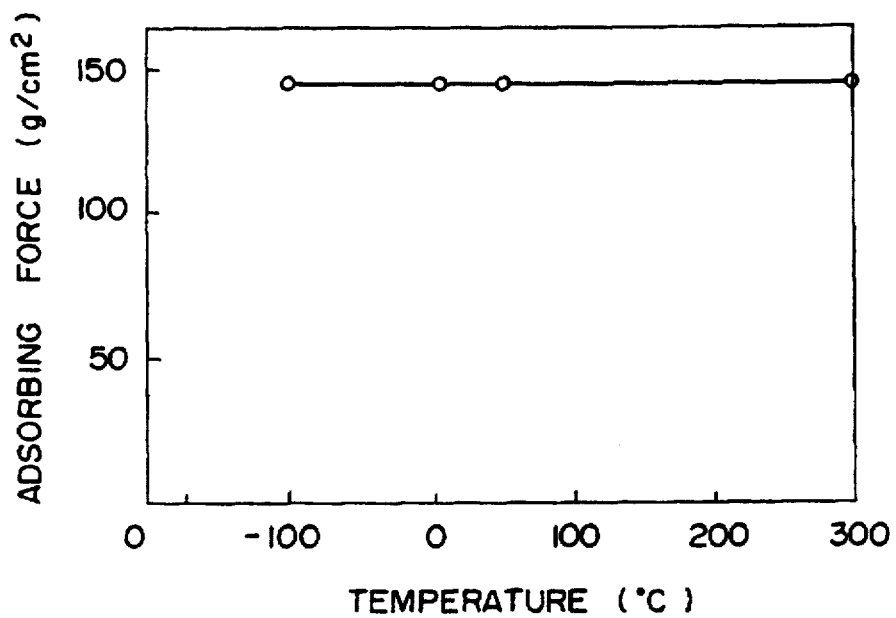
FIG. 9 is a diagram illustrating the temperature dependency of absorbing force of the electrostatic chuck of the present invention having the ceramic resistor layer doped with an element (Si) of the Group 4b of periodic table.

FIG. 5 shows the measured results of the temperature dependency of volume resistivity of the electrostatic chuck using the sample No. 64, and FIG. 9 shows the measured results of the temperature dependency of absorbing force of when a voltage of 400 V is applied to the electrode of the electrostatic chuck of FIG. 1 using the AlN film of the sample No. 64. As will be obvious from FIGS. 5 and 9, the volume resistivity lies within a range of from $7.8 \times 10^{10}$ to $1.5 \times 10^{12}$ $\Omega$-cm over the whole temperature range of from –100° C. to 300° C. As is obvious from FIG. 5, furthermore, the absorbing force remains constant over the above temperature range, and stable absorbing force is obtained.

In the electrostatic chuck (sample No. 58) in which the element of the Group 4b of periodic table is contained in the AlN film at an impurity level only, however, the volume resistivity abruptly changed from $10^{15}$ $\Omega$-cm to $10^{11}$ $\Omega$-cm as the temperature of measurement changed from 25° C. to 300° C. Therefore, extended periods of time were required before the absorbing force was stabilized at 150° C. and 200° C., and the residual absorbing force was observed, too.

We claim:

1. A ceramic resistor comprising an aluminum nitride crystal phase, wherein the resistor is doped with at least one kind of atom selected from the group consisting of elements of Groups 2b, 4b and 6b of the periodic table, which exhibits a volume resistivity of not larger than about $10^{14}$ $\Omega$-cm at 25° C., wherein the ceramic resistor is doped with an element of Group 4b of the periodic table in an amount of from 0.005 to 30 atomic %, and the lattice constants in the aluminum nitride crystal phase are shifted from the lattice constants of the non-doped aluminum nitride single phase by 0.003 to 0.030 angstroms on the a-axis and by 0.004 to 0.080 angstroms on the c-axis.

2. The ceramic resistor of claim 1, wherein the doped atoms comprise silicon atoms.

3. An electrostatic chuck having a ceramic resistor layer comprising an aluminum nitride crystal phase on the surface of a substrate which has an electrode, wherein the resistor layer is doped with at least one kind of atom selected from the group consisting of elements of Groups 2b, 4b and 6b of the periodic table and exhibits a volume resistivity over a range of from about 107 to about $10^{13}$ $\Omega$-cm at 25° C., wherein the ceramic resistor layer is doped with an element of Group 4b of the periodic table in an amount of from 0.01 to 25 atomic %, and the lattice constants in the aluminum nitride crystal phase are shifted from the lattice constants of the non-doped aluminum nitride single phase by 0.004 to 0.025 angstroms on the a-axis and by 0.005 to 0.050 angstroms on the c-axis.

* * * * *